United States Patent
Ohto

(10) Patent No.: US 7,133,539 B2
(45) Date of Patent: Nov. 7, 2006

(54) THREE-DIMENSIONAL TERRAIN-INFORMATION GENERATING SYSTEM AND METHOD, AND COMPUTER PROGRAM THEREFOR

(75) Inventor: Yasunori Ohto, Tokyo (JP)

(73) Assignee: Sony Corporation, Tokyo (JP)

( * ) Notice: Subject to any disclaimer, the term of this patent is extended or adjusted under 35 U.S.C. 154(b) by 728 days.

(21) Appl. No.: 10/385,492

(22) Filed: Mar. 12, 2003

(65) Prior Publication Data

US 2004/0027344 A1    Feb. 12, 2004

(30) Foreign Application Priority Data

Mar. 27, 2002    (JP)    ............................. 2002-089966

(51) Int. Cl.
*G06K 9/00*    (2006.01)
(52) U.S. Cl. ............................ 382/113; 382/154; 702/5
(58) Field of Classification Search .............. 382/113, 382/154; 702/5
See application file for complete search history.

(56) References Cited

U.S. PATENT DOCUMENTS 5,864,632 A * 1/1999 Ogawa et al. .............. 382/113
5,974,170 A * 10/1999 Louis et al. ................. 382/154
6,654,690 B1 * 11/2003 Rahmes et al. ................. 702/5
6,714,664 B1 * 3/2004 Kambe et al. .............. 382/113
6,970,593 B1 * 11/2005 Furukawa .................... 382/154
6,996,505 B1 * 2/2006 Edelsbrunner et al. ......... 703/2

* cited by examiner

Primary Examiner—Bhavesh M. Mehta
Assistant Examiner—John B Strege
(74) Attorney, Agent, or Firm—Oblon, Spivak, McClelland, Maier & Neustadt, P.C.

(57)    ABSTRACT

A three-dimensional terrain-information generating system extracts a road region from altitude information arranged on a two-dimensional plane and adjusts the position and scale by matching the road region with a building/road map. Altitude information of a road region with a width that is greater than or equal to a preset width is obtained from the building/road map, and the obtained altitude information is arranged in a three-dimensional space. Ribbon forms that may intersect one another at a plurality of points are generated. Altitude information of a region such as a park that is almost free from the effects of a building on the three-dimensional terrain is obtained from the building/road map. Subsequently, a surface including such altitude information is created, thereby generating three-dimensional terrain data.

14 Claims, 14 Drawing Sheets

THREE-DIMENSIONAL TERRAIN-INFORMATION GENERATING SYSTEM AND METHOD, AND COMPUTER PROGRAM THEREFOR

BACKGROUND OF THE INVENTION

1. Field of the Invention

The present invention relates to three-dimensional terrain-information generating systems and methods and computer programs therefor for generating terrain information including the relief of the ground. In particular, the present invention relates to a three-dimensional terrain-information generating system and method and a computer program therefor for extracting the three-dimensional shape of the ground on the basis of altitude information of the ground, which is obtained by an airplane, a satellite, or the like.

More particularly, the present invention relates to a three-dimensional terrain-information generating system and method and a computer program therefor for extracting the three-dimensional shape of the ground using altitude information mapped onto a two-dimensional plane and building/road information. In particular, the present invention relates to a three-dimensional terrain-information generating system and method and a computer program therefor for extracting the three-dimensional shape of the ground from which buildings are eliminated.

2. Description of the Related Art

With the recent innovation of information technology, various types of information content are created and edited on computers to offer services such as information storage and information distribution. For example, map information indicating buildings and roads is integrated with geographic information on a computer to offer services that present regional information using map images for road guidance and tourist information. Also, real-time navigation services have been offered to mobile stations such as vehicles and ships using a user's current position information detected by GPS (Global Positioning System) or the like.

A map, landform, or geographic information is not only obtained by measurement on the ground, but also created on the basis of the results of observation from space by an airplane, a satellite, or the like. A recent airplane with a range sensor can compute the three-dimensional shape of the ground on the basis of measured altitude information of the ground. Maps, in general, are orthographic projections, whereas aerial photographs and satellite photographs are central projections. Altitude information measured from space is compensated for geographical errors, and the altitude information is made into an ortho-image on the basis of the accurate geographic information, allowing the altitude information to be mapped onto observation points on the map. (In the description, "elevation-data" refers to data generated by mapping altitude information to each observation point on a two-dimensional plane.)

Basically, map information is two-dimensional planar position information. The integration of the map information with such altitude information allows the relief of the ground to be represented. As a result, for example, a navigation system displays a stereoscopic three-dimensional map image by taking the relief of the ground and landscape into consideration. Such higher quality map information display services are thus offered. Alternatively, the three-dimensional map information is applied to public services such as flood control simulation or systems using virtual space.

In the suburbs and mountains, measurement of the range from space to the ground directly and easily generates altitude information covering an extensive region. On the other hand, in central cities and downtown areas crowded with buildings, the distance, not to the ground, but to ground covering objects such as houses and buildings is measured, resulting in an error component of terrain information.

In the use of altitude information (z) disposed on a plane (x, y), the altitude information is subjected to a moving average filter or the like to minimize the effects of unevenness due to ground covering objects such as buildings. Alternatively, altitude information of regions corresponding to building regions that are obtained from a building map is eliminated. Subsequently, each piece of the altitude information serves as a spatial point at (x, y, z). The adjacent spatial points are connected to create a polygon mesh, and polygon reduction is performed to obtain the three-dimensional shape of the ground.

The above-described techniques are disadvantageous in that the buildings' altitude information is included in terrain data.

SUMMARY OF THE INVENTION

Accordingly, it is an object of the present invention to provide an improved three-dimensional terrain-information generating system and method and a computer program therefor for suitably extracting the three-dimensional shape of the ground on the basis of the ground's altitude information obtained by an airplane, a satellite, or the like.

It is another object of the present invention to provide an improved three-dimensional terrain-information generating system and method and a computer program therefor for suitably extracting the three-dimensional shape of the ground using altitude information that is mapped onto a two-dimensional plane and building/road information.

It is a further object of the present invention to provide an improved three-dimensional terrain-information generating system and method and a computer program therefor for accurately extracting the three-dimensional shape of the ground from which buildings are eliminated.

In order to achieve the foregoing objects, according to a first aspect of the present invention, there is provided a three-dimensional terrain-information generating system or method for generating more accurate terrain by mapping elevation-data including altitude information that is mapped onto a two-dimensional plane onto building/road map information and by removing effects of a building. The system or method includes a flow analyzer or a flow analyzing step that extracts a flow portion from the elevation-data; a matching unit or step that receives the extracted flow portion and that matches coordinates of the elevation-data with coordinates on a building/road map; a reference region obtaining unit or step that obtains a reference region for creating three-dimensional terrain data from the elevation-data; and a surface fitting unit or step that performs the fitting of a surface so that the surface includes the reference region on a face thereof.

The word "system" refers to a logical set of apparatuses (or functional modules for realizing specific functions). The apparatuses or functional modules need not be contained in a single casing.

According to the three-dimensional terrain-information generating system or method according to the first aspect of the present invention, a road region is extracted from altitude information arranged on a two-dimensional plane. The road region is matched with a building/road map to adjust the position and scale. Altitude information of a road region with a width greater than or equal to a specified width is obtained from the building/road map, and the obtained altitude information is arranged in a three-dimensional space. Ribbon forms that may intersect one another at a plurality of points are generated. Altitude information of a region such as a park that is almost free from the effects of a building on the three-dimensional terrain is obtained from the building/road map. Subsequently, a surface including such altitude information is created, thereby generating three-dimensional terrain data.

According to the present invention, more accurate three-dimensional terrain information (terrain of the ground) is obtained by suitably removing the effects of a ground covering object such as a building from altitude information arranged on a two-dimensional plane and a building/road map. Therefore, more accurate three-dimensional terrain data can be used in public services such as flood control simulation or systems using virtual space.

The flow analyzer or the flow analyzing step may extract, from the elevation-data, a region having altitude information that indicates a long, narrow, and gently winding region and that changes smoothly and continuously as the flow portion.

Since a highway region is wide, it is not influenced by buildings located on both sides thereof. On the basis of the knowledge that the highway region is long, narrow, and gently winding and has a smoothly and continuously changing altitude, the highway region can be extracted from the elevation data.

More specifically, the flow analyzer or the flow analyzing step may obtain a road region by generating an image to which pixel values corresponding to the altitude information are mapped, decomposing the image into frequency components by a Fourier transform, extracting a frequency component corresponding to the road region, performing an inverse Fourier transform, and extracting contours of the road region.

The matching unit or step may obtain a transform from the building/road map information to the elevation-data by matching the flow portion extracted by the flow analyzer or the flow analyzing step with a road region included in the building/road map information. The matching unit or step may obtain the altitude of a region other than a building-located region from the altitude information included in the elevation-data corresponding to the building/road map and may perform a surface approximation using the transform.

The reference region obtaining unit or step may extract a region including a park that is free from the effects of the building as the reference region.

The surface fitting unit or step may generate a surface including the reference region by an approximation of a Non-Uniform Rational B-Spline (NURBS) surface.

The surface fitting unit or step may adjust the NURBS surface by minimizing a square error of NURBS parameters, and, when the NURBS surface cannot be adjusted, may tessellate the NURBS surface into smaller sections.

According to a second aspect of the present invention, there is provided a computer program written in a computer readable format to perform, on a computer system, the processing of generating three-dimensional terrain information by mapping elevation-data including altitude information that is mapped onto a two-dimensional plane onto building/road map information and by removing effects of a building. The computer program includes a flow analyzing step of extracting a flow portion from the elevation-data; a matching step of receiving the extracted flow portion and matching coordinates of the elevation-data with coordinates on a building/road map; a reference region obtaining step of obtaining a reference region for creating three-dimensional terrain data from the elevation-data; and a surface fitting step of performing the fitting of a surface so that the surface includes the reference region on a face thereof.

The computer program according to the second aspect of the present invention defines a computer program written in a computer-readable format to perform predetermined processing on a computer system. In other words, the cooperative operation is achieved on the computer system by installing the computer program according to the second aspect of the present invention into the computer system. Accordingly, operation and advantages similar to those of the three-dimensional terrain-information generating system or method according to the first aspect of the present invention are achieved.

According to the present invention, the three-dimensional shape of the ground can be suitably extracted on the basis of altitude information of the ground, which is obtained by an airplane, a satellite, or the like. Also, the three-dimensional shape of the ground can be suitably extracted using altitude information that is mapped onto a two-dimensional plane and building/road information. Also, the three-dimensional shape of the ground from which buildings are eliminated can be accurately extracted. In other words, more accurate three-dimensional terrain information (landform) can be obtained by suitably removing the effects of ground covering objects such as buildings from altitude information arranged on a two-dimensional plane and a building/road map. Therefore, more accurate three-dimensional terrain data can be used in public services such as flood control simulation or systems using virtual space.

Further objects, features, and advantages of the present invention will become apparent from the following description of the preferred embodiments with reference to the attached drawings.

DESCRIPTION OF THE PREFERRED EMBODIMENTS

With reference to the drawings, embodiments of the present invention will be described in detail.

Figure 1:
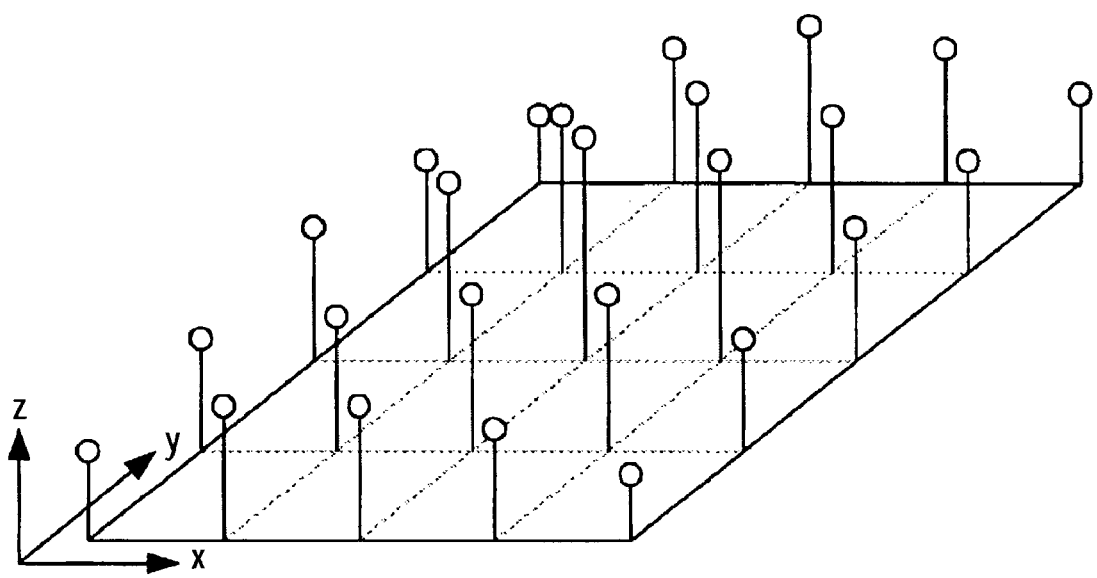
FIG. 1 is an illustration of the mapping of altitude information onto a two-dimensional plane.

FIG. 1 shows the mapping of altitude information onto a two-dimensional plane. The two-dimensional plane shown in FIG. 1 represents the ground surface of a plain, mountain, suburb, or central city. Altitude information or elevation-data is obtained at predetermined intervals in the x and y directions and represented as a z-coordinate value of each point at the coordinates (x, y). The x and y axes correspond to, for example, the latitude and longitude, respectively.

Two-dimensional plane information including such altitude information covering an extensive region can be directly and easily generated by, for example, obtaining a range from space to the ground using an airplane, a satellite, or the like. Altitude information measured from space is compensated for geographical errors, and the altitude information is made into an ortho-image on the basis of the accurate geographic information. As a result, the altitude information is mapped to each observation point on a map.

A two-dimensional plane to which altitude information is mapped, such as that shown in FIG. 1, represents the pseudo-relief of the ground or the like. In central cities or downtown areas crowded with buildings, altitude information directly generated by obtaining a range from space using an airplane, a satellite, or the like does not indicate the distance from space to the ground, but indicates the distance from space to ground covering objects such as buildings. Such altitude information includes an error component of terrain information.

Figure 2:
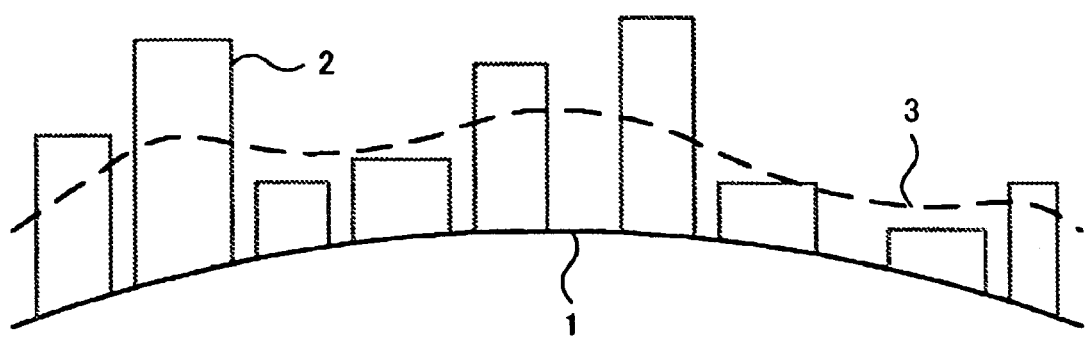
FIG. 2 is an illustration of the effects of a building on the actual landform when a smoothing filter is used.

Hitherto, the effects of unevenness of altitude information, which is caused by the ground covering objects such as buildings, have been removed using a smoothing filter such as a moving average filter. FIG. 2 shows the effects of buildings on the actual landform when a smoothing filter is used. Specifically, FIG. 2 shows the actual landform 1, building data 2 on surface covering objects such as buildings, and terrain data 3 generated using the smoothing filter.

As is clear from FIG. 2, with the known method of removing ground covering objects, the terrain data 3 is influenced by the building data 2 and indicates higher altitudes than the actual landform 1. Unevenness of the building group may be reflected in the terrain data 3 depending on the averaged area.

Figure 3:
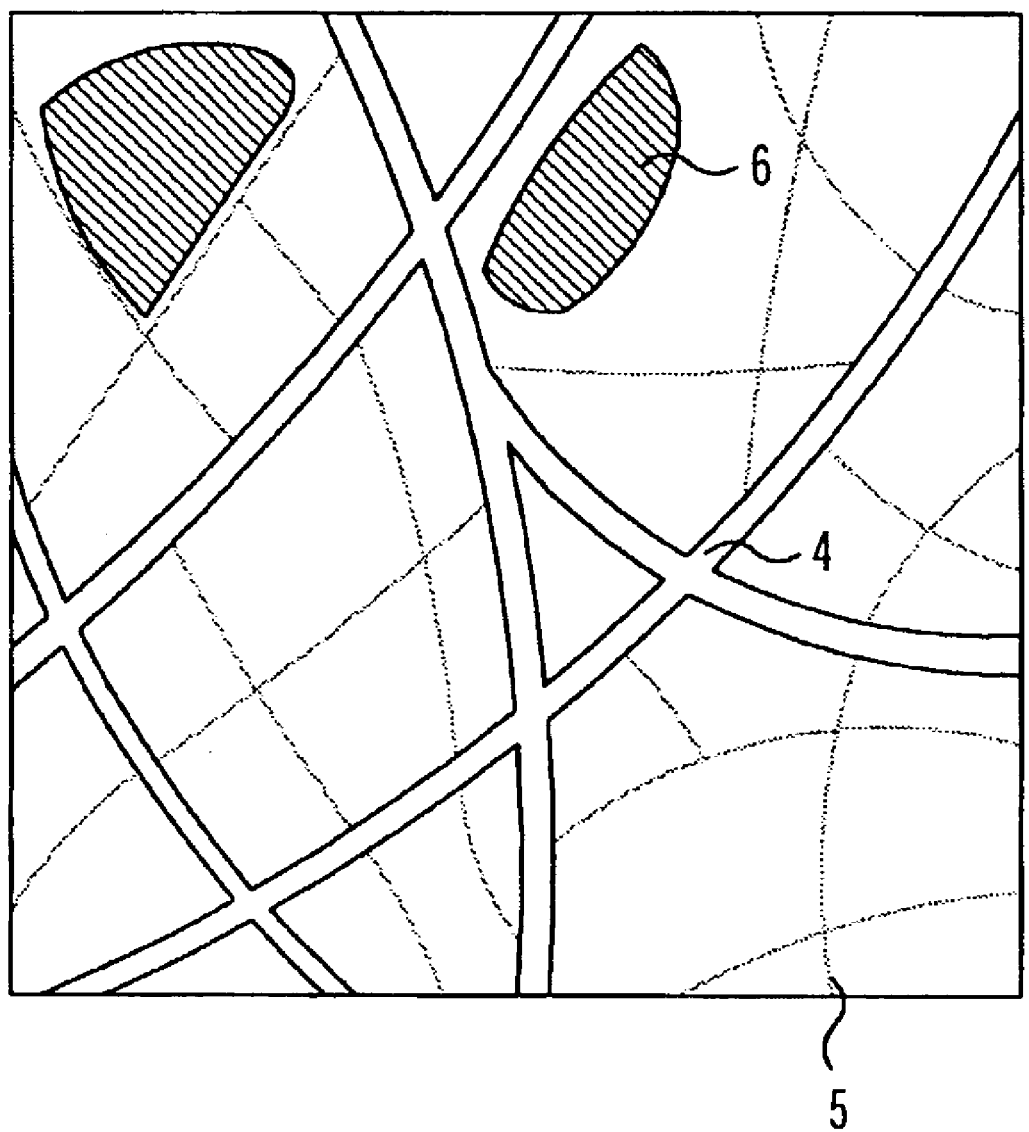
FIG. 3 is an illustration of reference regions for obtaining the terrain of the ground according to an embodiment of the present invention.
Figure 4:
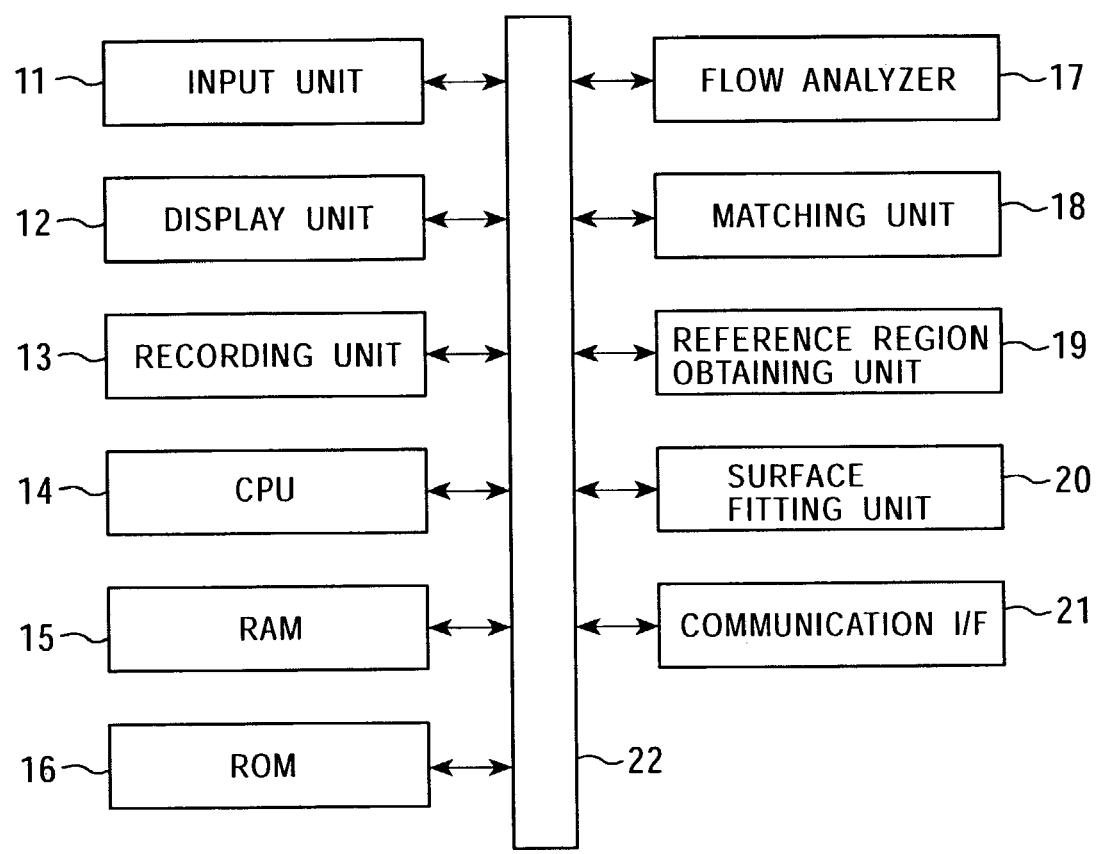
FIG. 4 is a block diagram showing the schematic functional configuration of a three-dimensional terrain-formation generating system according to this embodiment.

FIG. 3 shows examples of reference regions for obtaining the terrain of the ground according to an embodiment of the present invention. Referring to FIG. 4, since a highway region 4 is wide, the highway region 4 is not influenced by buildings located on both sides of the highway. The highway region 4 is long, narrow, and gently winding and has a smoothly and continuously changing altitude. Using such knowledge, the highway region 4 can be extracted from the elevation-data.

A road 5 is a relatively narrow road that cannot be reliably extracted by the above knowledge-based method. Regions 6 represent parks or vacant areas that are not influenced by buildings. In this embodiment, because altitude information in the regions 6 is not influenced by buildings, a surface including, on a face thereof, the altitude information in such regions is created.

FIG. 4 schematically shows the functional configuration of a three-dimensional terrain-information generating system 10 according to the embodiment of the present invention.

In the three-dimensional terrain-information generating system 10, a CPU (Central Processing Unit) 14 activates various application programs in an execution environment provided by an OS (Operating System). The CPU 14 is interconnected via a bus 22 to components in the three-dimensional terrain-information generating system 10.

A RAM (Random Access Memory) 15 is a volatile semiconductor memory. The RAM 15 is used to load therein program code to be executed by the CPU 14 from an external storage unit such as a recording unit 13 (described below) and to temporarily store work data being processed by an executed program.

The programs executed by the CPU 14 include a three-dimensional terrain-information generating application for mapping elevation-data onto a two-dimensional plane and for removing the effects of buildings. The work data includes two-dimensional plane information such as building information and road map information, elevation-data mapped onto the two-dimensional plane information, elevation-data from which the effects of buildings are being removed and have been removed, and values calculated during the removing of the buildings' effects.

A ROM (Read Only Memory) 16 is a non-volatile semiconductor memory and is used to permanently store predetermined program code and data. The ROM 16 stores, for example, a power-on self-test (POST) program activated upon activation of the three-dimensional terrain-information generating system 10, a basic input/output software (BIOS) for operating the hardware component in the three-dimensional terrain-information generating system 10, and the like.

An input unit 11 is formed of, for example, a user input unit such as a keyboard or a mouse. The input unit 11 is used to manually input, or by any other methods, raw data such as building/road map information and elevation-data for generating three-dimensional terrain information or to input a user command for generating three-dimensional terrain information or other user commands.

A display unit 12 is formed of a display or a printer that visualizes the arithmetic computation results by the CPU 14 and outputs the results to a user. For example, the display unit 12 displays and outputs building/road map information, three-dimensional terrain information generated by removing the effects of buildings from elevation-data mapped onto a two-dimensional plane, or the computation results during the removing of the effects of buildings.

The recording unit 13 is formed of, for example, a high-capacity fixed external storage unit such as a hard disk drive (HDD) or a read/write unit such as a CD (DVD)-ROM drive including a portable recording medium.

The HDD is an external storage unit having a magnetic disk serving as a fixed storage medium (as is well known). The HDD is superior to other external storage units because of the storage capacity and data transfer rate. Placing a software program in an executable state on the HDD is referred to as "installing" of the program into the system. Generally, the HDD has stored therein program code of the operating system, application programs, and device drivers that are to be executed by the CPU 14 in a nonvolatile manner. For example, the three-dimensional terrain information generating application for mapping elevation-data onto a two-dimensional plane and for removing the effects of buildings can be installed on the HDD. Two-dimensional plane information such as building information and road map information, which is processed during the three-dimensional terrain information generation, elevation-data (initial values), elevation-data mapped onto a two-dimensional plane, from which the effects of buildings are removed, and other libraries can be stored on the HDD.

The portable recording medium is primarily used to back up software programs and data files in the form of data in a computer-readable format or to transfer such software programs and data files between systems (including sales and distribution). For example, the three-dimensional terrain-information generating application for mapping elevation-data onto a two-dimensional plane and for removing the effects of buildings can be physically distributed among a plurality of apparatuses using such portable recording media. Such portable recording media are used to provide, to the outside of the system, two-dimensional plane information such as building information and road map information, which is processed during the three-dimensional terrain information generation, elevation-data (initial values), and elevation-data that is supplied with other libraries and/or mapped onto a two-dimensional plane, from which the effects of buildings are removed.

A communication interface 21 connects the three-dimensional terrain-information generating system 10 to a local network such as a LAN (Local Area Network) and, furthermore, to a WAN (Wide Area Network) such as the Internet in accordance with predetermined communication protocols such as Ethernet (registered trademark). A plurality of host terminals (not shown) are transparently connected to one another on the network to construct a distributed computing environment. Distribution services providing software programs and data content can be offered on the network. For example, the three-dimensional terrain-information generating application for mapping elevation-data onto a two-dimensional plane and for removing the effects of buildings can be downloaded via the network. The network is used to provide, to the outside of the system, two-dimensional plane information such as building information and road map information, which is processed during the three-dimensional terrain information generation, elevation-data (initial values), and elevation-data that is supplied with other libraries and/or mapped onto a two-dimensional plane, from which the effects of buildings are removed.

A flow analyzer 17, a matching unit 18, a reference region obtaining unit 19, and a surface fitting unit 20 cooperate with the CPU 14 to realize the three-dimensional terrain information generation involving the removing of the effects of buildings from elevation-data that is mapped onto a two-dimensional plane. The flow analyzer 17 extracts a road region (highway region) from input elevation-data (initial values). The matching unit 18 receives the extracted road region and matches the coordinates of the elevation-data with the coordinates on a building/road map. The reference region obtaining unit 19 obtains reference regions for creating three-dimensional terrain data. The surface fitting unit 20 performs the fitting of a surface so that the surface includes the reference region on a face thereof.

Figure 5:
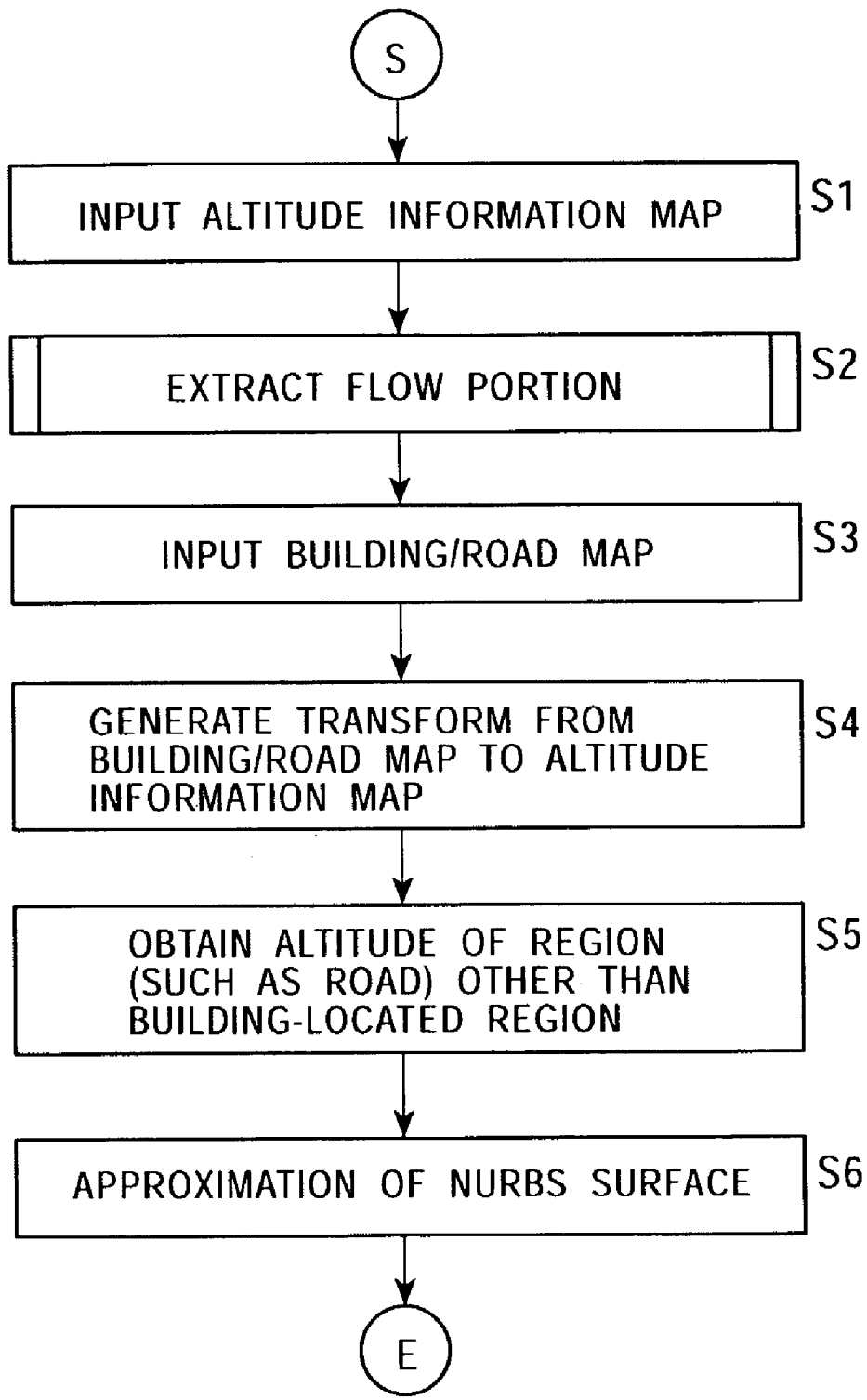
FIG. 5 is a flowchart showing a schematic process of mapping, by the three-dimensional terrain-information generating system according to this embodiment, elevation-data onto a two-dimensional plane and removing the effects of buildings.

FIG. 5 is a flowchart showing a schematic process of generating, by the three-dimensional terrain-information generating system 10 according to this embodiment, the terrain of the ground by mapping elevation-data (including altitude information mapped onto a two-dimensional plane) to building/road map information and by removing the effects of buildings. The process is actually realized by executing, by the CPU 14, the three-dimensional terrain-information generating application in cooperation with the flow analyzer 17, the matching unit 18, the reference region obtaining unit 19, and the surface fitting unit 20.

An altitude information map (elevation-data) is input to the three-dimensional terrain-information generating system 10 (step S1). The elevation-data is, as shown in FIG. 1, mapped onto a two-dimensional xy plane.

The flow analyzer 17 analyzes the flow of the elevation-data, which has been mapped onto the two-dimensional plane, and extracts a flow portion such as a highway that is long, narrow, and gently winding and that has a smoothly and continuously changing altitude (step S2).

A building/road map is input to the three-dimensional terrain-information generating system 10 (step S3). The building/road map is matched with the flow portion extracted in step S2, thereby generating a transform from the building/road map to the elevation-data (described below) (step S4).

The altitude of regions other than building-located regions is obtained from altitude information included in the elevation-data corresponding to the building/road map (step S5). Approximation of a NURBS surface is performed (step S6).

Figure 12:
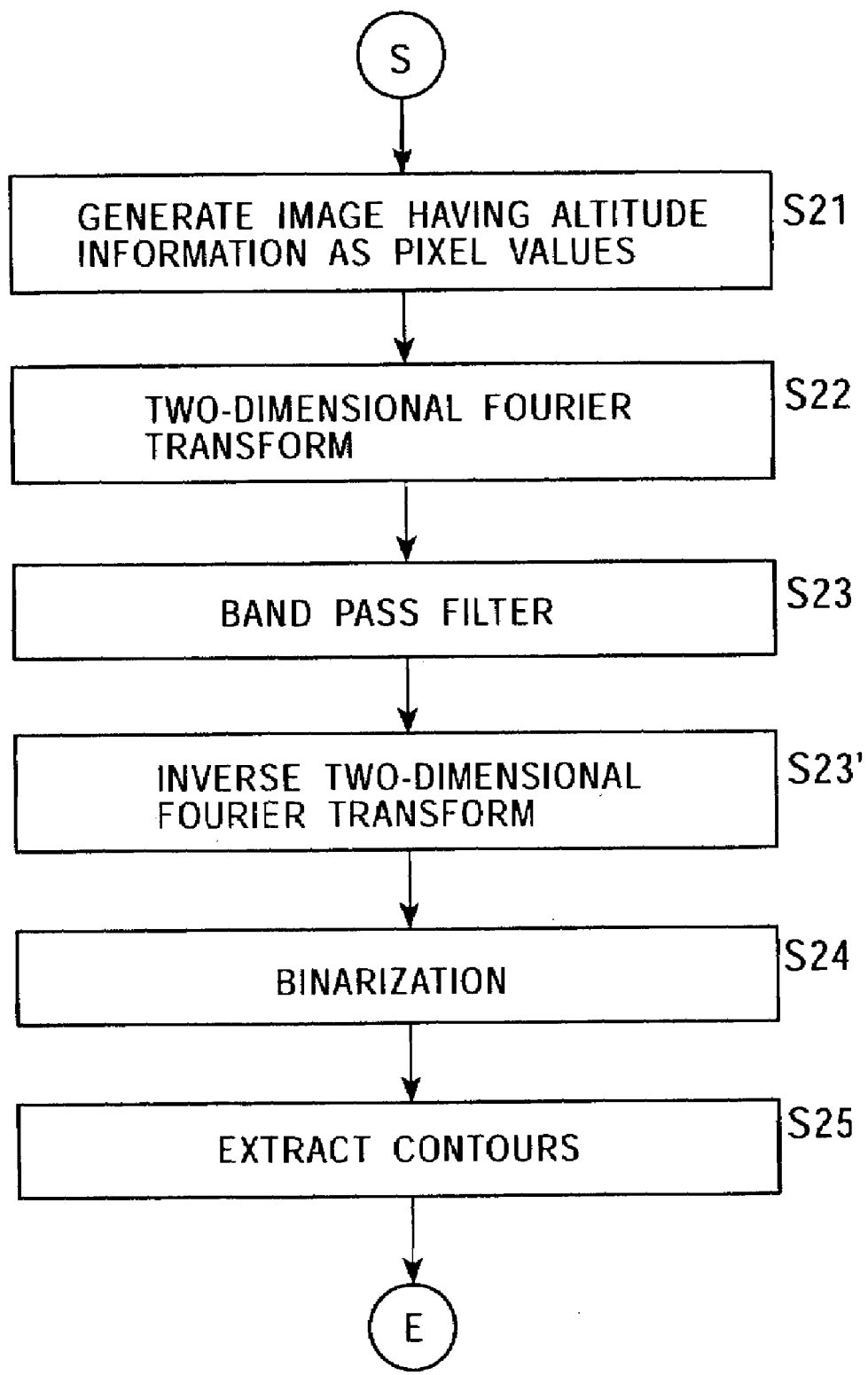
FIG. 12 is a flowchart showing a detailed process of extracting road regions from the elevation-data.
Figure 13:
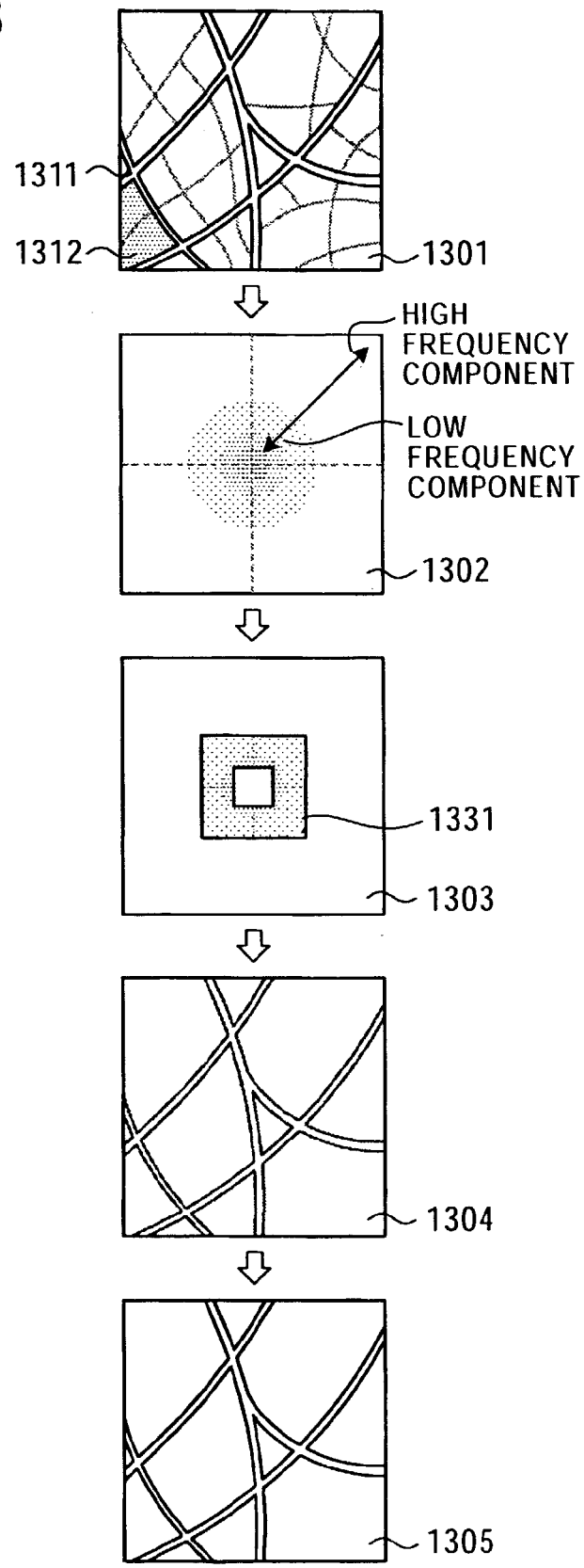
FIG. 13 includes illustrations of the manner in which road regions are extracted.

In step S2, the flow analyzer 17 extracts a road region as a flow portion from the elevation-data. FIG. 12 is a flowchart showing a detailed process of extracting a road region from elevation-data. FIG. 13 shows the manner in which a road region is extracted.

The elevation-data is transformed into an image having an elevation value at each observation point as a pixel value (step S21). Referring to FIG. 13, an image 1301 is the result of the image transformation.

A two-dimensional Fourier transform is applied to the image 1301 (step S22) to transform pixel information into frequency information. Referring to FIG. 13, a region 1302 represents the result of the two-dimensional Fourier transform. In the example shown in FIG. 13, a building region 1312 having buildings has more high frequency components due to variations in altitude of the buildings. In contrast, a road region 1311 has a relatively smoothly changing altitude and thus has more low frequency components.

A band pass filter allowing the road region to pass is applied (step S23), and then an inverse two-dimensional Fourier transform is applied (step S23') to transform the frequency information into pixel information. FIG. 13 shows a band pass filter 1303 allowing a frequency component 1331 corresponding to the road region to pass. FIG. 13 also shows pixel information 1304 generated by applying the band pass filter and then the inverse two-dimensional Fourier transform.

Since the road region is located at a relatively low position, the road region is binarized (step S24), and the contours thereof are extracted (step S25). The contours define a road region. Referring to FIG. 13, an image 1304 shows the result of binarization of the pixel information generated by the inverse Fourier transform, and an image 1305 shows the result of contour extraction.

Figure 14:
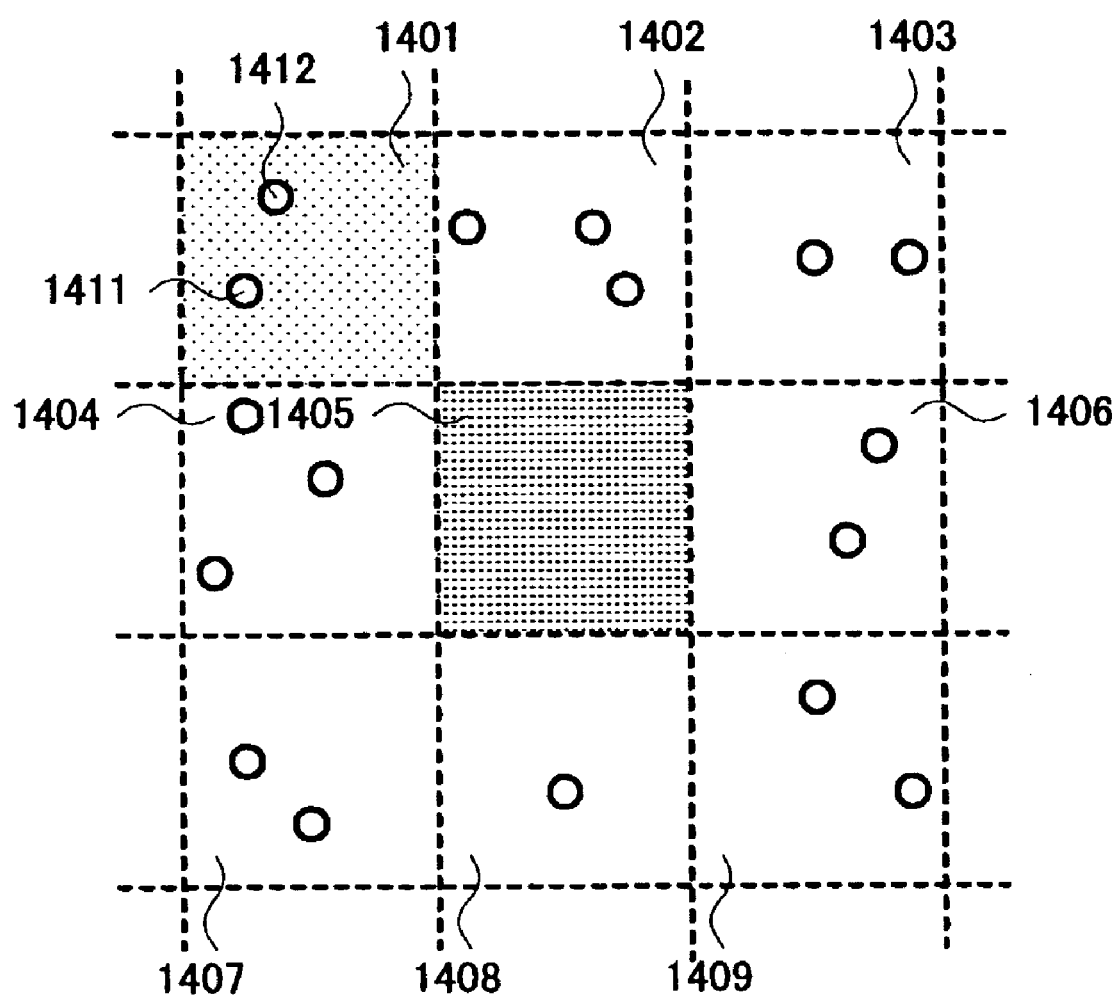
FIG. 14 is an illustration of a method of computing a gray level at the position of each pixel.

Extraction of a road region by the above-described method requires replacement of altitude information at each observation point in elevation-data with a pixel, that is, a gray value. With reference to FIG. 14, a method of obtaining a gray value at a pixel position will now be described.

FIG. 14 shows image pixels 1401 to 1409 and observation points 1411 and 1412. Each image pixel has a pixel value that is an average of elevation values at observation points included therein.

The pixel value of the image pixel 1401 is an average of elevation values at the observation points 1411 and 1412.

As in the image pixel 1405, if an image pixel contains no observation point, the pixel value of that image pixel is obtained as an average of pixel values of the surrounding pixels. In the example shown in FIG. 14, the pixel value of the image pixel 1405 is obtained as an average of pixel values of the surrounding image pixels 1401 to 1404 and 1406 to 1409. If an adjacent image pixel contains no observation point, interpolation is performed using the pixel values of surrounding image pixels.

Figure 6:
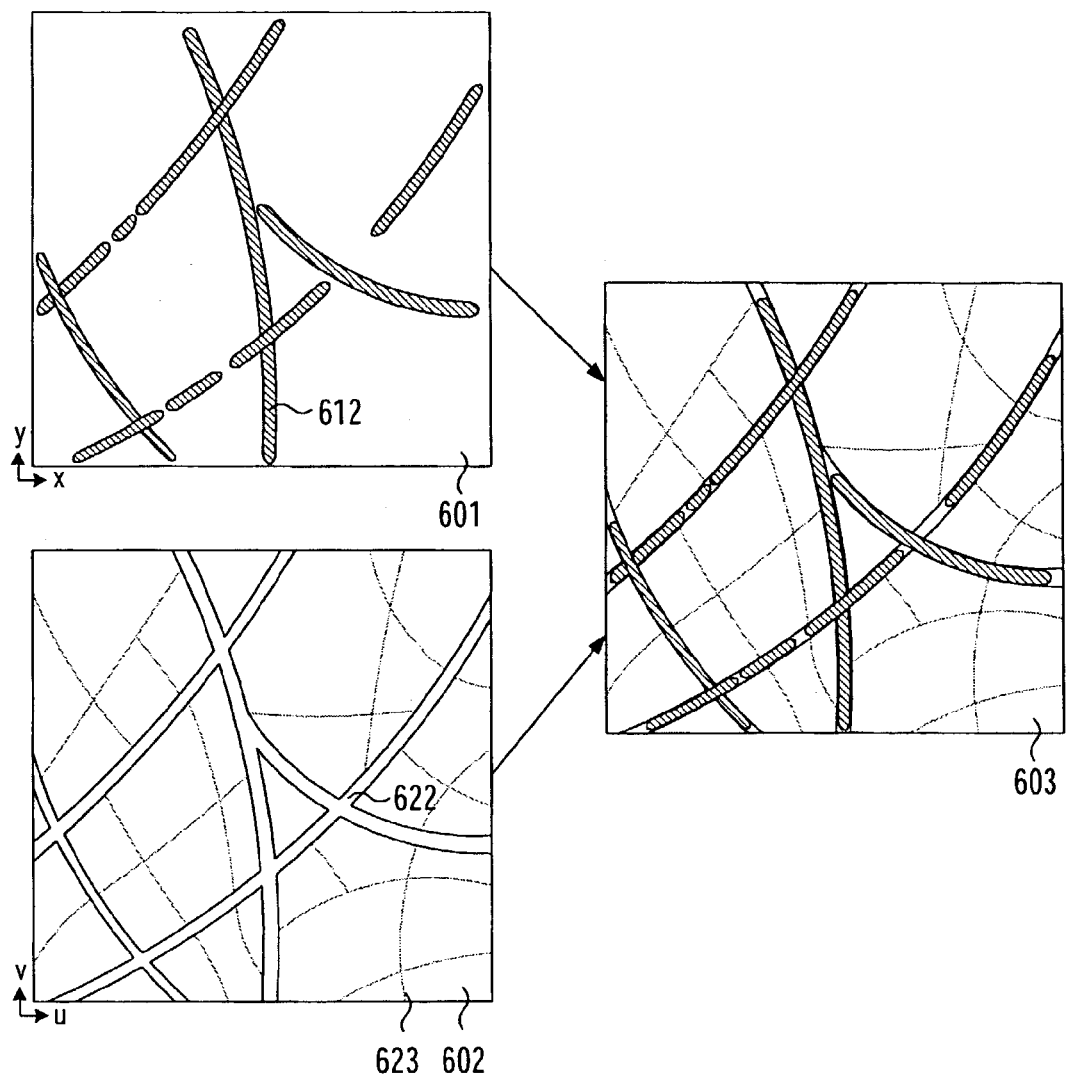
FIG. 6 illustrates a method of obtaining a coordinate transform from a building/road map to elevation-data.

FIG. 6 illustrates the scheme for obtaining, in step S4 of the flowchart shown in FIG. 5, a coordinate transform from the building/road map to the elevation-data.

Elevation-data 601 is data from which a flow portion 612 is extracted by the flow analyzer 17. The flow portion 612 corresponds to a highway region and is extracted because the highway region is a region that has smoothly and continuously changing altitude information and that is long, narrow, gently winding, and continuous. Since the highway region is wide, the highway region is not influenced by buildings located on both sides thereof.

A building/road map 602 includes a highway region 622 and a road region 623 having a width specified by a user, other than the highway region 622. The highway region 622 and the road region 623 are road regions that can be used to obtain the three-dimensional terrain.

An image 603 shows the result of matching, by the matching unit 18, between the elevation-data 601 from which the flow portion 612 has been extracted and the building/road map 602.

The matching unit 18 obtains the following coordinate transform from building/road map coordinates (u, v, 1) to elevation-data (x, y, 1):

$$\begin{pmatrix} x \\ y \\ 1 \end{pmatrix} \leftarrow SRT \begin{pmatrix} u \\ v \\ 1 \end{pmatrix} \quad (1)$$

wherein matrix S represents scaling transformation, which is characterized by scales a and b:

$$S = \begin{pmatrix} a & 0 & 0 \\ 0 & b & 0 \\ 0 & 0 & 1 \end{pmatrix} \quad (2)$$

In the coordinate transform described above, matrix R represents rotational transformation, which is characterized by a rotation θ:

$$R = \begin{pmatrix} \cos\theta & -\sin\theta & 0 \\ \sin\theta & \cos\theta & 0 \\ 0 & 0 & 1 \end{pmatrix} \quad (3)$$

In the coordinate transform described above, matrix T represents parallel translation, which is expressed by a translation vector (c, d):

$$T = \begin{pmatrix} 0 & 0 & 0 \\ 0 & 0 & 0 \\ c & d & 1 \end{pmatrix} \quad (4)$$

Figure 7:
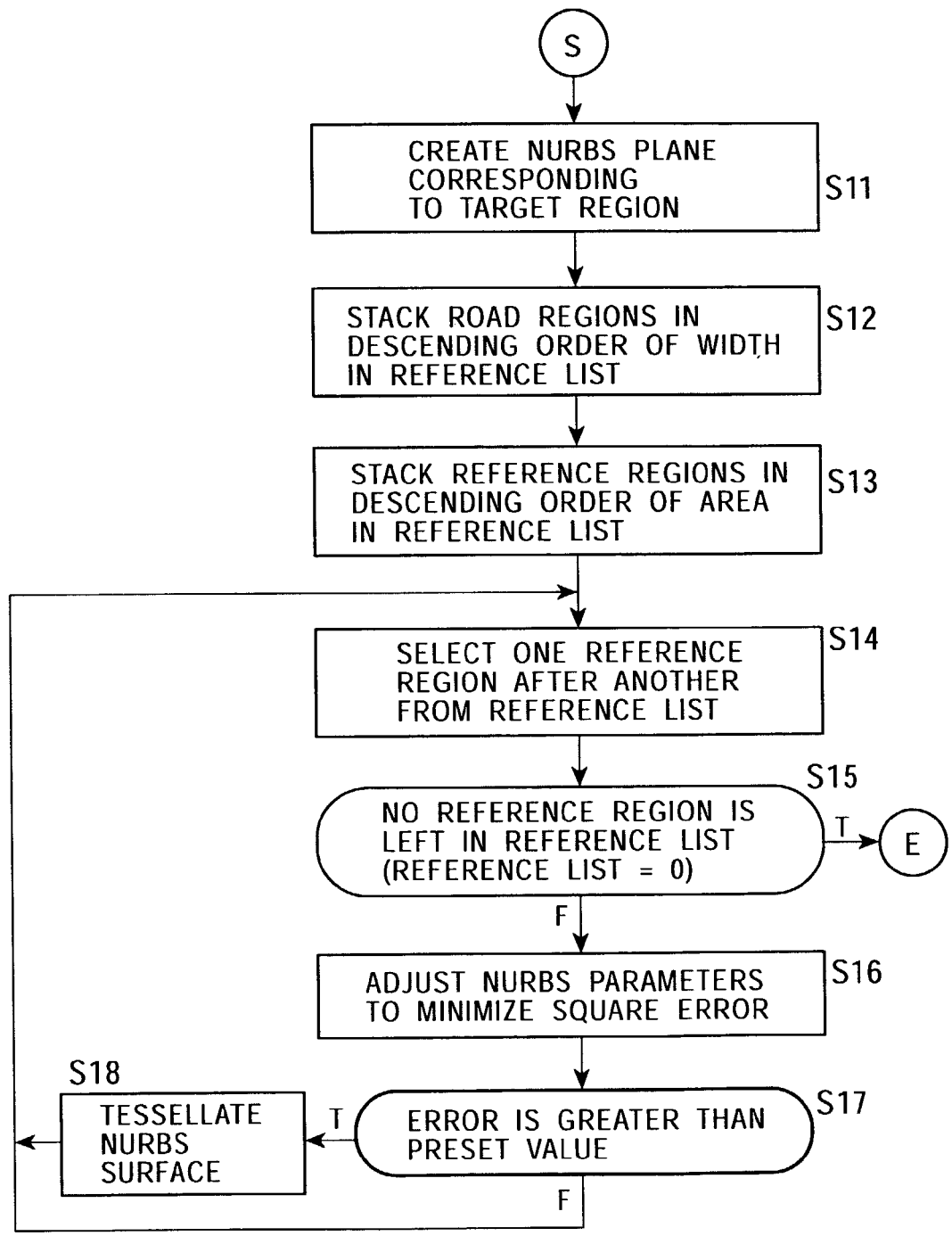
FIG. 7 is a flowchart showing a process of obtaining reference regions from the elevation-data and obtaining a surface including the reference regions on a face thereof.

FIG. 7 is a flowchart showing a process of obtaining reference regions from elevation-data and obtaining a surface including the reference regions on a face thereof. The process is realized by executing, on the three-dimensional model generating system 10, by the CPU 14, the three-dimensional terrain-information generating application in cooperation with the reference region obtaining unit 19 and the surface fitting unit 20.

The surface fitting unit 20 creates a NURBS plane corresponding to a target region (step S11). A NURBS surface is a typical geometric form representation method for representing planes, quadric surfaces, and free-form surfaces and has knots serving as adjustable parameters. In this embodiment, a plane having 3×3 knots disposed at equal intervals is created.

The reference region obtaining unit 19 stacks road regions in descending order of width into a reference list (step S12), and then stacks reference regions such as parks in descending order of area into the reference list (step S13).

One reference region is selected after another until the reference list becomes empty (steps S14 and S15), and the reference region is fitted by adjusting the NURBS knots.

In this embodiment, the reference regions are optimized by annealing. Specifically, the 3×3 knots serving as the NURBS parameters are adjusted by minimizing a square error of the knots (step S16). When the minimum square error is greater than a preset value (step S17), the NURBS surface is tessellated into smaller sections (step S18).

It is generally known that annealing results in local solutions. On the other hand, since the three-dimensional shape of the target ground is generally not complex, and the NURBS surface has characteristics in that the knots have local influence, annealing leads to an optimal solution. If the equilibrium state is achieved while the square error is greater than the preset value, a mesh portion with the large square error is tessellated into smaller sections, and the fitting is continuously performed.

Figure 8:
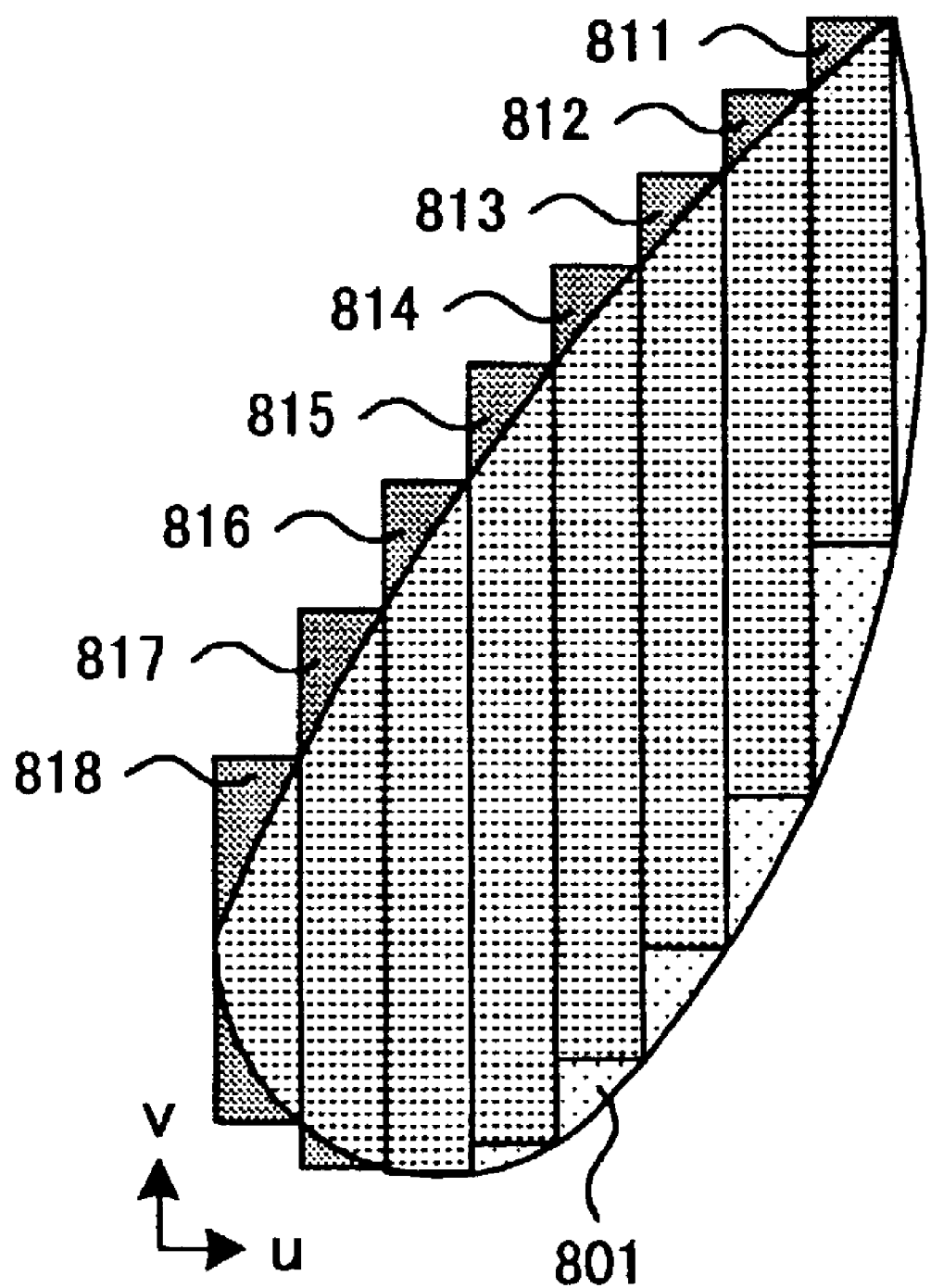
FIG. 8 is an illustration of a method of computing the area of a region having no building.

The reference region extracting process, which is shown in FIG. 7, extracts reference regions in descending order of area. In this embodiment, a region with no building is processed as a set of strips. FIG. 8 illustrates the manner in which the area of a region with no building is computed.

A region with no building 801 is regarded as a set of strips 811 to 818. On the basis of the uv coordinate system shown in FIG. 8, the strips 811 to 818 are generated by cutting them out of the region 801 in the u direction and by aligning them so that the right edges thereof correspond to values of the region 801 in the v direction. The area of each of the strips 811 to 818 is calculated, and the sum of the areas is computed as the area of the region 801. Needless to say, the area of the region with no building 801 can be computed by methods other than that shown in FIG. 8.

Figure 9:
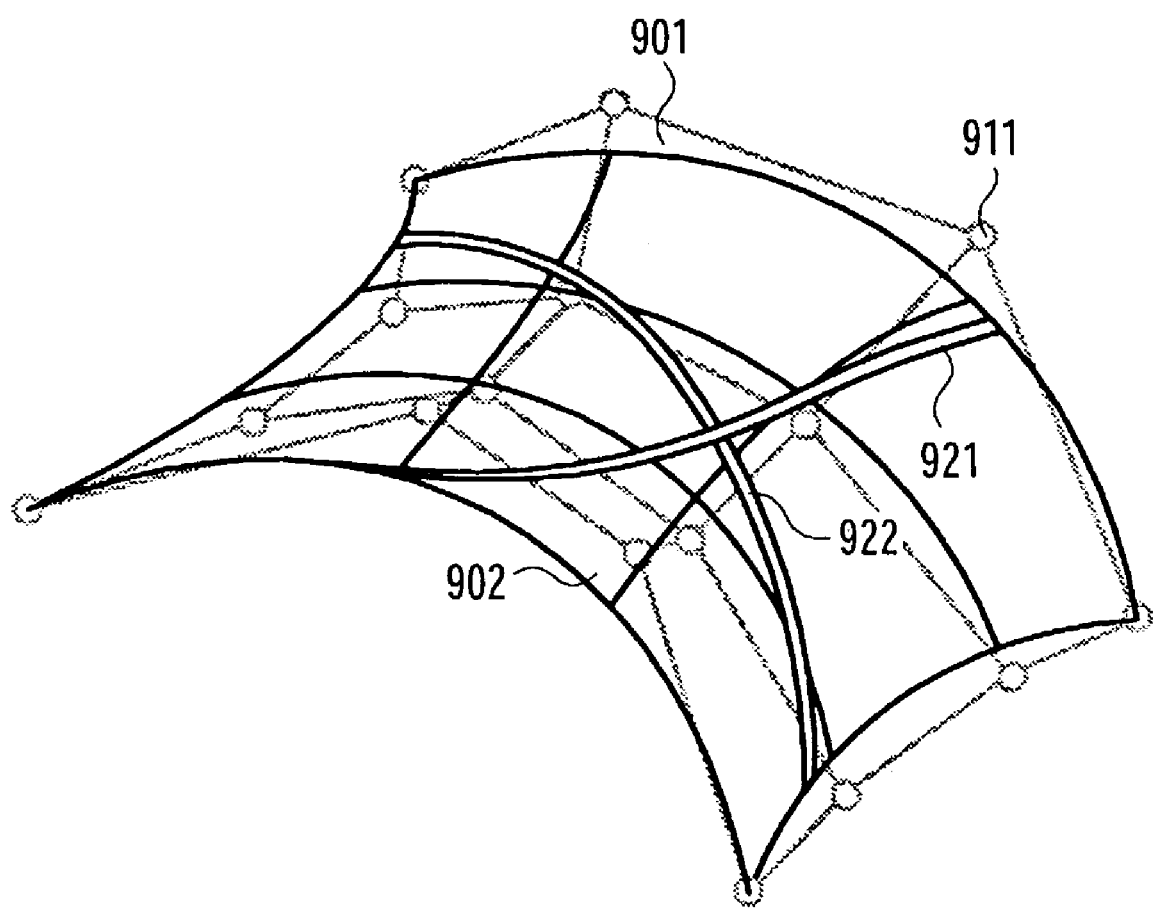
FIG. 9 is an illustration of the manner in which the reference regions are fitted to a surface by moving knots that describe the surface.

The surface fitting process shown in FIG. 7 performs optimization by moving the knots that describe the surface so that the reference regions are fitted to the surface. FIG. 9 shows the manner in which the reference regions are fitted by moving the knots of the NURBS surface.

Referring to FIG. 9, a control polygon 901 that characterizes a target surface 902 has control points 911. Road regions 921 and 922 are to be fitted to a face of the target surface 902.

Figure 10:
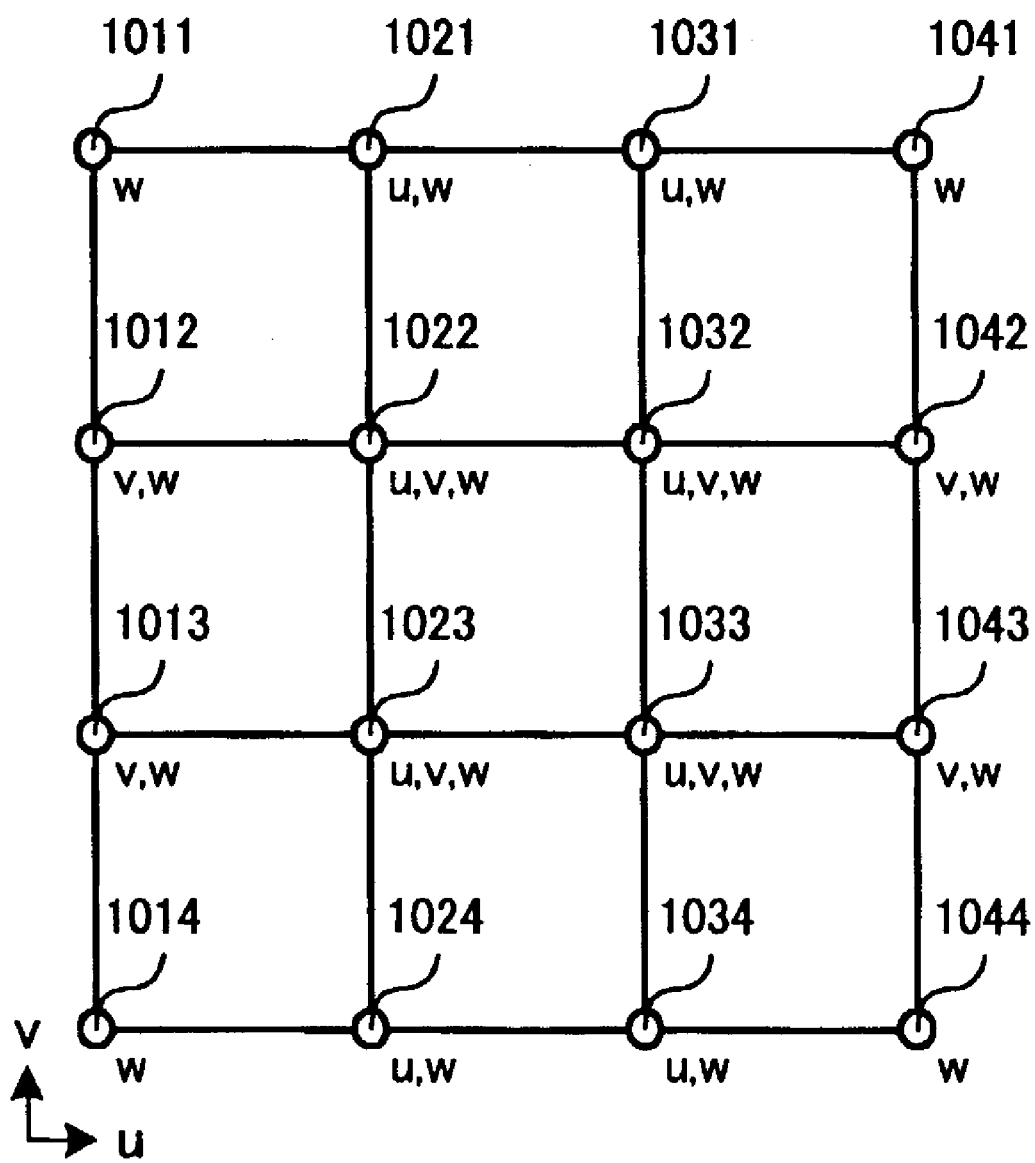
FIG. 10 is an illustration of directions in which knots of a NURBS surface can move.

A method for adjusting parameters of a NURBS surface will now be described. FIG. 10 shows directions in which knots can move.

Referring to FIG. 10, knots 1011, 1041, 1014, and 1044 are allowed to move only vertically (w direction). Knots 1021, 1031, 1024, and 1034 are allowed to move only in the u and w directions. Knots 1012, 1013, 1042, and 1043 are allowed to move only in the v and w directions. The other knots 1022, 1032, 1023, and 1033 are allowed to move in all directions (u, v, and w directions).

This characteristic is maintained in tessellated control polygons only when they share the outermost contours with the original control polygon.

Figure 11:
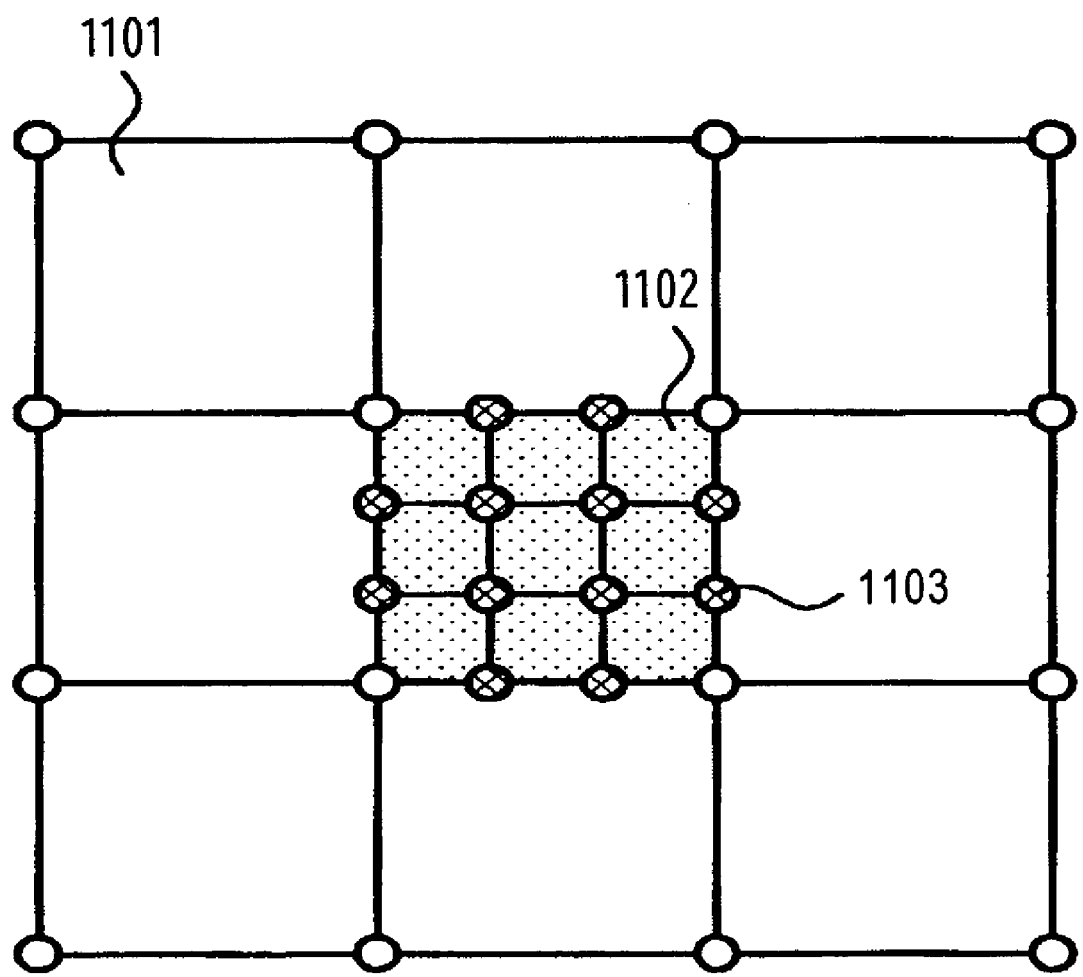
FIG. 11 is an illustration of the manner in which a portion with a large error is tessellated into smaller sections when the reference regions cannot be fitted to the surface.

The surface fitting process shown in FIG. 7 tessellates the NURBS surface when the NURBS surface cannot be adjusted. FIG. 11 shows the manner in which a portion with a large error is tessellated when the reference regions cannot be fitted.

Referring to FIG. 11, a control polygon 1101 includes a tessellated control polygon 1102 with knots 1103 for controlling the tessellated control polygon 1102. This gives rise to a restriction on the movement of control points, requiring a smooth surface to be formed of the original surface and the tessellated surfaces.

While the present invention has been described with reference to what are presently considered to be the preferred embodiments, it is to be understood that modifications and substitutions can be made by those skilled in the art without departing from the scope of the present invention. In other words, the present invention has been described using the embodiments only for illustration purposes and should not be interpreted in a limited manner. The scope of the present invention is to be determined solely by the appended claims.

It is to be understood by those skilled in the art that the present invention is easily extended by replacing the word "building" in the appended claims with, for example, an artificial structure such as a bridge, bank, or breakwater or a natural structure such as a mountain, cliff or rock. In other words, it is to be understood that various three-dimensional model generating apparatuses, methods, systems, and programs using (1) information on ground regions and (2) information on other regions that can be distinguished from the ground, both of which are included in two-dimensional map data, are considered to be equivalents of the present invention as long as they are based on a spirit similar to the present invention. In this case, the information on ground regions and the information on other regions that can be distinguished from the ground may be used instead of the two-dimensional map data.

It is to be understood by those skilled in the art that the present invention is easily extended by replacing the word "elevation-data" in the appended claims with simple altitude data. In other words, it is to be understood that various three-dimensional model generating apparatuses, methods, systems, and programs using information on ground regions, information on other regions that can be distinguished from the ground, and altitude data are considered to be equivalents of the present invention as long as they are based on a spirit similar to the present invention.

Japanese Patent Application No. 2002-089967 (filed on Mar. 27, 2002) discloses three-dimensional modeling of a building portion using information on ground regions, information on other regions that can be distinguished from the ground, and altitude data. Japanese Patent Application No. 2002-089966 (filed on Mar. 27, 2002) discloses three-dimensional modeling of a terrain portion using information on ground regions, information on other regions that can be distinguished from the ground, and altitude data. The complete disclosures of these Japanese patent applications are incorporated herein by reference.

What is claimed is:

1. A three-dimensional terrain-information generating system for generating three-dimensional terrain information by mapping elevation-data including altitude information that is mapped onto a two-dimensional plane onto building/road map information and by removing effects of a building, comprising:

a flow analyzer that extracts a flow portion from the elevation-data, said flow portion including elevation data for a long area having a defined width and smoothly changing altitude information;

a matching unit that receives the extracted flow portion and that matches coordinates of the elevation-data with coordinates on a building/road map;

a reference region obtaining unit that obtains a reference region for creating three-dimensional terrain data from the elevation-data; and a surface fitting unit that performs the fitting of a surface so that the surface includes the reference region on a face thereof.

2. The three-dimensional terrain-information generating system according to claim 1, wherein the flow analyzer extracts, from the elevation-data, a region having altitude information that indicates a long, narrow, and gently winding region and that changes smoothly and continuously as the flow portion.

3. The three-dimensional terrain-information generating system according to claim 1, wherein the flow analyzer obtains a road region by generating an image to which pixel values corresponding to the altitude information are mapped, decomposing the image into frequency components by a Fourier transform, extracting a frequency component corresponding to the road region, performing an inverse Fourier transform, and extracting contours of the road region.

4. The three-dimensional terrain-information generating system according to claim 1, wherein the matching unit obtains a transform from the building/road map information to the elevation-data by matching the flow portion extracted by the flow analyzer with a road region included in the building/road map information, obtains the altitude of a region other than a building-located region from the altitude information included in the elevation-data corresponding to the building/road map, and performs a surface approximation using the transform.

5. The three-dimensional terrain-information generating system according to claim 1, wherein the reference region obtaining unit extracts a region including a park that is free from the effects of the building as the reference region.

6. A three-dimensional terrain-information generating system for generating three-dimensional terrain information by mapping elevation-data including altitude information that is mapped onto a two-dimensional plane onto building/road map information and by removing effects of a building, comprising:

a flow analyzer that extracts a flow portion from the elevation-data;

a matching unit that receives the extracted flow portion and that matches coordinates of the elevation-data with coordinates on a building/road map;

a reference region obtaining unit that obtains a reference region for creating three-dimensional terrain data from the elevation-data; and a surface fitting unit that performs the fitting of a surface so that the surface includes the reference region on a face thereof, wherein the surface fitting unit generates a surface including the reference region by an approximation of a Non-Uniform Rational B-Spline (NURBS) surface, and wherein the surface fitting unit adjusts the NURBS surface by minimizing a square error of NURBS parameters, and, when the NURBS surface cannot be adjusted, tessellates the NURBS surface into smaller sections.

7. A three-dimensional terrain-information generating method for generating three-dimensional terrain information by mapping elevation-data including altitude information that is mapped onto a two-dimensional plane onto building/road map information and by removing effects of a building, comprising: a flow analyzing step of extracting a flow portion from the elevation-data, said flow portion including elevation data for a long area having a defined width and smoothly changing altitude information;
 a matching step of receiving the extracted flow portion and matching coordinates of the elevation-data with coordinates on a building/road map;
 a reference region obtaining step of obtaining a reference region for creating three-dimensional terrain data from the elevation-data; and
 a surface fitting step of performing the fitting of a surface so that the surface includes the reference region on a face thereof.

8. The three-dimensional terrain-information generating method according to claim 7, wherein, in the flow analyzing step, a region having altitude information that indicates a long, narrow, and gently winding region and that changes smoothly and continuously is extracted as the flow portion from the elevation-data.

9. The three-dimensional terrain-information generating method according to claim 7, wherein, in the flow analyzing step, a road region is obtained by generating an image to which pixel values corresponding to the altitude information are mapped, decomposing the image into frequency components by a Fourier transform, extracting a frequency component corresponding to the road region, performing an inverse Fourier transform, and extracting contours of the road region.

10. The three-dimensional terrain-information generating method according to claim 7, wherein, in the matching step, a transform from the building/road map information to the elevation-data is obtained by matching the flow portion extracted in the flow analyzing step with a road region included in the building/road map information, the altitude of a region other than a building-located region is obtained from the altitude information of the elevation-data corresponding to the building/road map, and a surface approximation is performed using the transform.

11. The three-dimensional terrain-information generating method according to claim 7, wherein, in the reference region obtaining step, a region including a park that is free from the effects of the building is extracted as the reference region.

12. The three-dimensional terrain-information generating method according to claim 11, wherein, in the surface fitting step, a surface including the reference region is generated by an approximation of a NURBS surface.

13. A three-dimensional terrain-information generating method for generating three-dimensional terrain information by mapping elevation-data including altitude information that is mapped onto a two-dimensional plane onto building/road map information and by removing effects of a building, comprising: a flow analyzing step of extracting a flow portion from the elevation-data;
 a matching step of receiving the extracted flow portion and matching coordinates of the elevation-data with coordinates on a building/road map;
 a reference region obtaining step of obtaining a reference region for creating three-dimensional terrain data from the elevation-data; and
 a surface fitting step of performing the fitting of a surface so that the surface includes the reference region on a face thereof, wherein, in the surface fitting step, the NURBS surface is adjusted by minimizing a square error of NURBS parameters, and, when the NURBS surface cannot be adjusted, the NURBS surface is tessellated into smaller sections.

14. A computer program written in a computer readable format to perform, on a computer system, the processing of generating three-dimensional terrain information by mapping elevation-data including altitude information that is mapped onto a two-dimensional plane onto building/road map information and by removing effects of a building, comprising:
 a flow analyzing step of extracting a flow portion from the elevation-data, said flow portion including elevation data for a long area having a defined width and smoothly changing altitude information;
 a matching step of receiving the extracted flow portion and matching coordinates of the elevation-data with coordinates on a building/road map;
 a reference region obtaining step of obtaining a reference region for creating three-dimensional terrain data from the elevation-data; and
 a surface fitting step of performing the fitting of a surface so that the surface includes the reference region on a face thereof.

* * * * *